United States Patent
Suzuki

(10) Patent No.: US 12,256,134 B2
(45) Date of Patent: Mar. 18, 2025

(54) IMAGE CAPTURING APPARATUS THAT CAN EFFICIENTLY RADIATE HEAT FROM AN IMAGE SENSOR AND REDUCE THE LOAD APPLIED TO THE IMAGE SENSOR

(71) Applicant: CANON KABUSHIKI KAISHA, Tokyo (JP)

(72) Inventor: Kei Suzuki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 133 days.

(21) Appl. No.: 18/064,420

(22) Filed: Dec. 12, 2022

(65) Prior Publication Data

US 2023/0199289 A1      Jun. 22, 2023

(30) Foreign Application Priority Data

Dec. 17, 2021   (JP) .................... 2021-205129

(51) Int. Cl.
*H04N 23/52*  (2023.01)
*G03B 17/55*  (2021.01)
(Continued)

(52) U.S. Cl.
CPC .............. *H04N 23/52* (2023.01); *G03B 17/55* (2013.01); *H04N 23/51* (2023.01); *H04N 23/54* (2023.01);
(Continued)

(58) Field of Classification Search
CPC ........ H04N 23/51; H04N 23/52; H04N 23/54; H04N 23/55; H04N 23/57; H04N 23/79; H01L 27/14634; H01L 27/14636; H01L 27/14638; G03B 17/02; G03B 17/55; G03B 30/00; G03B 2217/00; G03B 2217/002; H05K 1/0201–021; H05K 5/04;
(Continued)

(56) References Cited

U.S. PATENT DOCUMENTS 9,176,298 B1    11/2015  Gustafson
9,658,423 B2    5/2017   Gustafson
(Continued)

FOREIGN PATENT DOCUMENTS

CN    105578736 A  *  5/2016  .......... H05K 1/0204
JP    6054720 B2      12/2016
(Continued)

OTHER PUBLICATIONS

U.S. Appl. No. 18/064,403, filed Dec. 12, 2022 "Lens Apparatus and Image Pickup Apparatus".
(Continued)

*Primary Examiner* — Twyler L Haskins
*Assistant Examiner* — Akshay Trehan
(74) *Attorney, Agent, or Firm* — Cowan, Liebowitz & Latman, P.C.

(57) ABSTRACT

An image pickup apparatus includes a housing, a first circuit board mounted with an image sensor, a second circuit board mounted with an electric element and is placed opposite to the first circuit board, a heat radiating sheet that contacts the image sensor or the first circuit board and the housing, and a flexible member placed between and contacting the heat radiating sheet and the second circuit board.

13 Claims, 5 Drawing Sheets

(51) Int. Cl.
  *H04N 23/51* (2023.01)
  *H04N 23/54* (2023.01)
  *H04N 23/55* (2023.01)
  *H04N 23/57* (2023.01)
  *H04N 25/79* (2023.01)
  *H05K 1/02* (2006.01)
  *H05K 5/04* (2006.01)
  *H05K 7/20* (2006.01)

(52) U.S. Cl.
  CPC .......... *H04N 23/55* (2023.01); *H04N 23/57* (2023.01); *H04N 25/79* (2023.01); *H05K 1/0203* (2013.01); *H05K 7/2039* (2013.01); *H05K 5/04* (2013.01)

(58) Field of Classification Search
  CPC ...... H05K 7/2039–20518; B60R 11/04; G06F 1/1686; H04M 1/0264
  See application file for complete search history.

(56) References Cited

U.S. PATENT DOCUMENTS

| | | | |
|---|---|---|---|
| 10,054,757 B2 | 8/2018 | Knutsson | |
| 11,867,967 B2 | 1/2024 | Kim | |
| 11,966,040 B2 | 4/2024 | Ofir | |
| 2009/0237537 A1* | 9/2009 | Maruyama | G03B 17/55 348/294 |
| 2013/0093948 A1* | 4/2013 | Takeshita | H04N 23/54 348/374 |
| 2014/0104479 A1* | 4/2014 | Samuels | H04N 23/51 348/335 |
| 2014/0307162 A1* | 10/2014 | Li | H04N 23/57 348/373 |
| 2016/0295081 A1 | 10/2016 | Graff | |
| 2017/0042058 A1* | 2/2017 | Pope | H01L 23/3735 |
| 2017/0129418 A1* | 5/2017 | Koshiba | B60K 35/00 |
| 2017/0276895 A1 | 9/2017 | Sakuma et al. | |
| 2018/0107099 A1* | 4/2018 | Yasuda | G03B 17/55 |
| 2018/0234594 A1 | 8/2018 | Lim | |
| 2018/0241917 A1* | 8/2018 | Zhang | H04N 23/52 |
| 2019/0349507 A1* | 11/2019 | Lee | H04N 23/54 |
| 2019/0373142 A1* | 12/2019 | Fujiwara | H04N 23/54 |
| 2020/0033549 A1 | 1/2020 | Liu | |
| 2020/0049932 A1 | 2/2020 | Wei | |
| 2021/0302805 A1 | 9/2021 | Yoshida | |
| 2021/0397072 A1* | 12/2021 | Ding | H05K 1/0203 |
| 2022/0059266 A1 | 2/2022 | Saito | |
| 2022/0196963 A1 | 6/2022 | Suginome | |
| 2022/0357551 A1 | 11/2022 | Liu | |
| 2023/0098815 A1* | 3/2023 | Cho | G03B 30/00 348/374 |
| 2023/0152576 A1 | 5/2023 | Nozaki | |
| 2023/0194827 A1 | 6/2023 | Shuhei | |
| 2023/0199288 A1 | 6/2023 | Saito | |
| 2023/0199289 A1 | 6/2023 | Suzuki | |
| 2023/0213839 A1 | 7/2023 | Watanabe | |
| 2023/0244128 A1 | 8/2023 | Van Den Brink | |
| 2023/0367184 A1 | 11/2023 | Inaba | |
| 2023/0418020 A1 | 12/2023 | Hwang | |

FOREIGN PATENT DOCUMENTS

| | | |
|---|---|---|
| JP | 2017-098891 A | 6/2017 |
| JP | 2018-141861 A | 9/2018 |
| JP | 6391122 B2 | 9/2018 |
| JP | 2020-014003 A | 1/2020 |
| JP | 2020-027278 A | 2/2020 |
| JP | 6912530 B2 | 8/2021 |

OTHER PUBLICATIONS

U.S. Appl. No. 18/064,408, filed Dec. 12, 2022 " Image Pickup Apparatus".
U.S. Appl. No. 18/064,425, filed Dec. 12, 2022 " Image Pickup Apparatus".
Jun. 6, 2024 U.S. Office Action, which is not enclosed that issued in U.S. Appl. No. 18/064,408.
Jun. 11, 2024 Notice of Allowance, which is not enclosed that issued in U.S. Appl. No. 18/064,425.

* cited by examiner

IMAGE CAPTURING APPARATUS THAT CAN EFFICIENTLY RADIATE HEAT FROM AN IMAGE SENSOR AND REDUCE THE LOAD APPLIED TO THE IMAGE SENSOR

BACKGROUND

Technical Field

One of the aspects of the disclosure relates to an image pickup apparatus.

Description of the Related Art

A camera module mounted on a wearable terminal or the like is demanded to be made smaller in order to improve wearability. In addition, in order to maintain the performance of an image sensor, various heat radiating structures for the image sensor have been proposed. Japanese Patent Laid-Open No. ("JP") 2017-98891 discloses an image pickup apparatus that radiates heat from an imaging board to a housing by sandwiching a sheet metal as a heat transfer member between a first circuit board mounted with an image sensor and a second circuit board, and by bringing the sheet metal into contact with a heat radiating component of the housing. JP 2020-14003 discloses an electronic apparatus that radiates heat by filling a heat diffuser for radiating the heat from a circuit board in a deformable container and by disposing the heat diffuser in a deformed shape that follows the circuit board.

The image pickup apparatus disclosed in JP 2017-98891 sandwiches the sheet metal between the imaging board and a control board, and thus causes a load to be applied to the imaging board. The load applied to the imaging board may change the position of the image sensor and degrade the optical performance.

The electronic apparatus disclosed in JP 2020-14003 needs to dispose a pack container between boards for the heat radiation. Thus, the pressing force of the pack container changes due to variations in a distance between the boards and variations in tolerance of mounted elements, and may cause a load to be applied to a first circuit board. In addition, since the heat is radiated by using the pack container, the degree of freedom of the heat radiating path is reduced.

SUMMARY

The present invention provides an image pickup apparatus that can efficiently radiate heat from an image sensor and reduce the load applied to the image sensor.

An image pickup apparatus according to one aspect of the disclosure includes a housing, a first circuit board mounted with an image sensor, a second circuit board mounted with an electric element and is placed opposite to the first circuit board, a heat radiating sheet that contacts the image sensor or the first circuit board and the housing, and a flexible member placed between and contacting the heat radiating sheet and the second circuit board.

Further features of the disclosure will become apparent from the following description of exemplary embodiments with reference to the attached drawings.

DESCRIPTION OF THE EMBODIMENTS

Referring now to the accompanying drawings, a detailed description will be given of embodiments according to the disclosure.

First Embodiment

Figure 1:
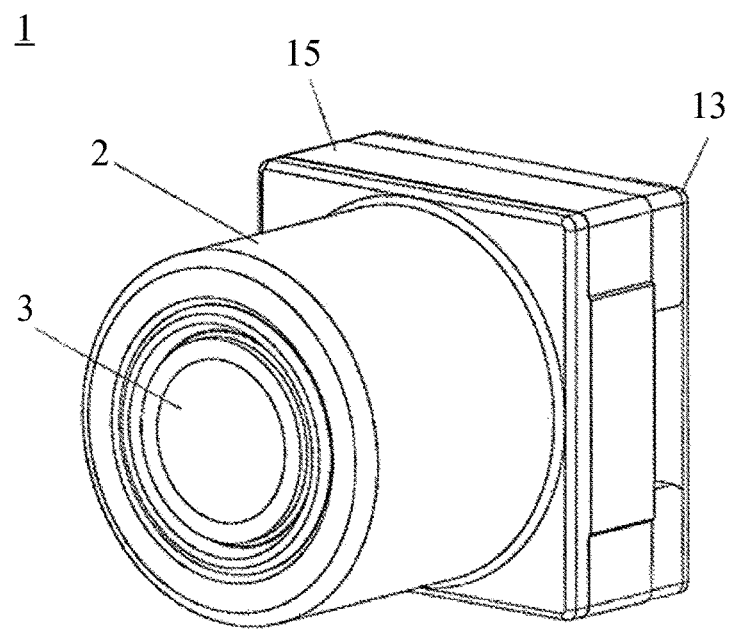
FIG. 1 is a perspective view of a camera module according to a first embodiment.
Figure 2:
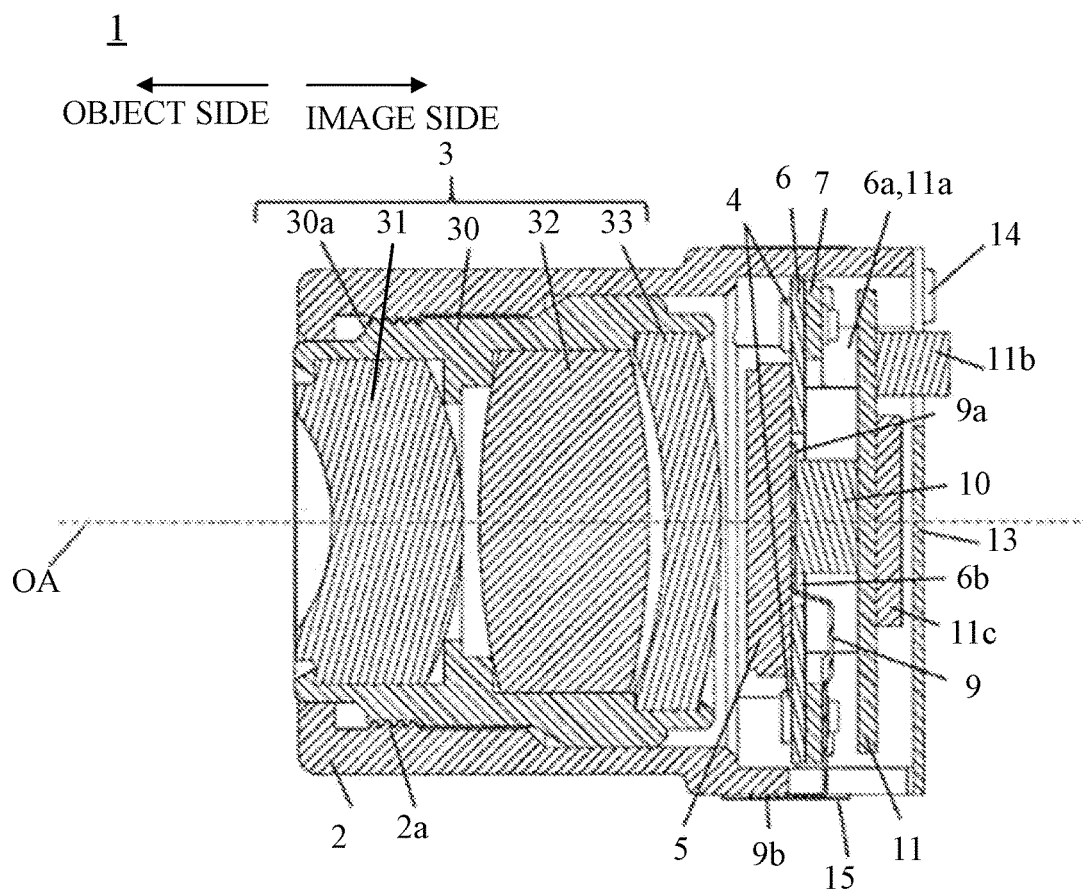
FIG. 2 is a sectional view of the camera module according to the first embodiment.
Figure 3:
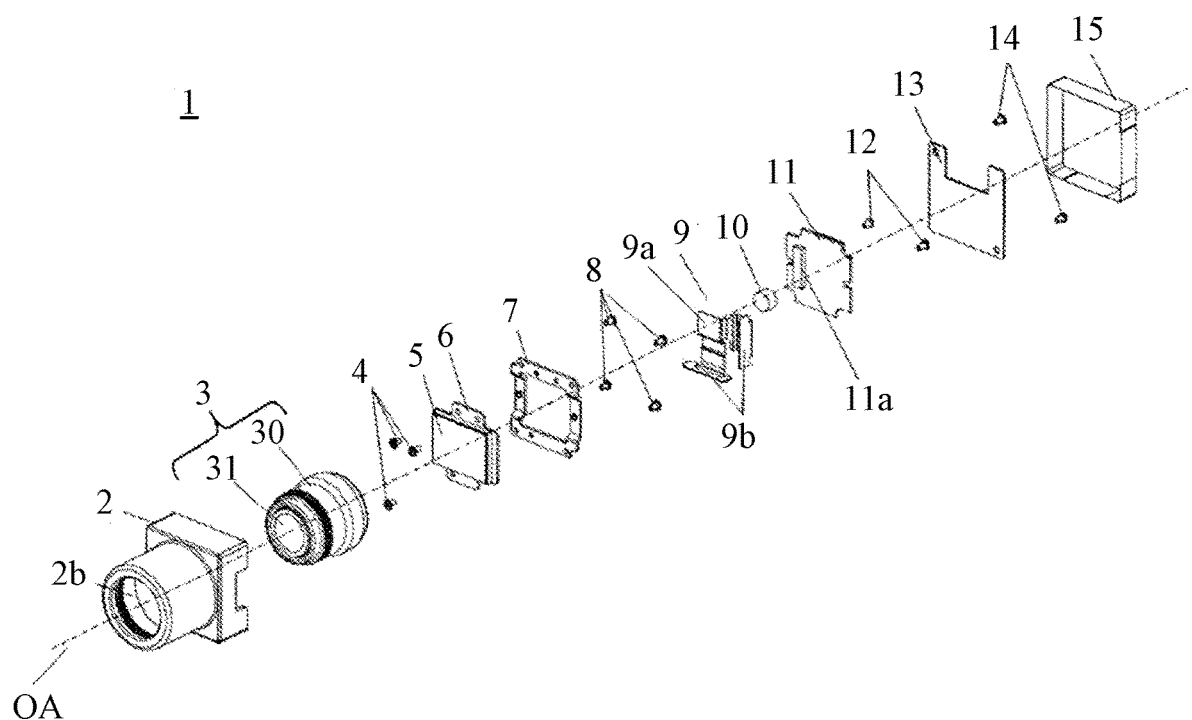
FIG. 3 is an exploded perspective view of the camera module according to the first embodiment viewed from an object side.
Figure 4:
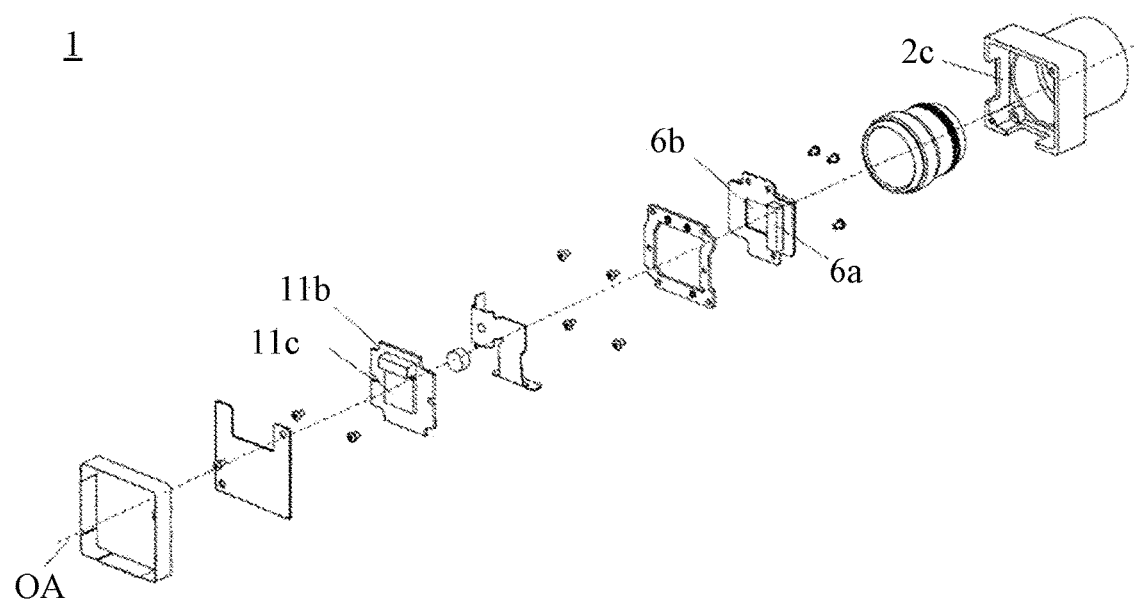
FIG. 4 is an exploded perspective view of the camera module according to the first embodiment viewed from an image side.
Figure 5:
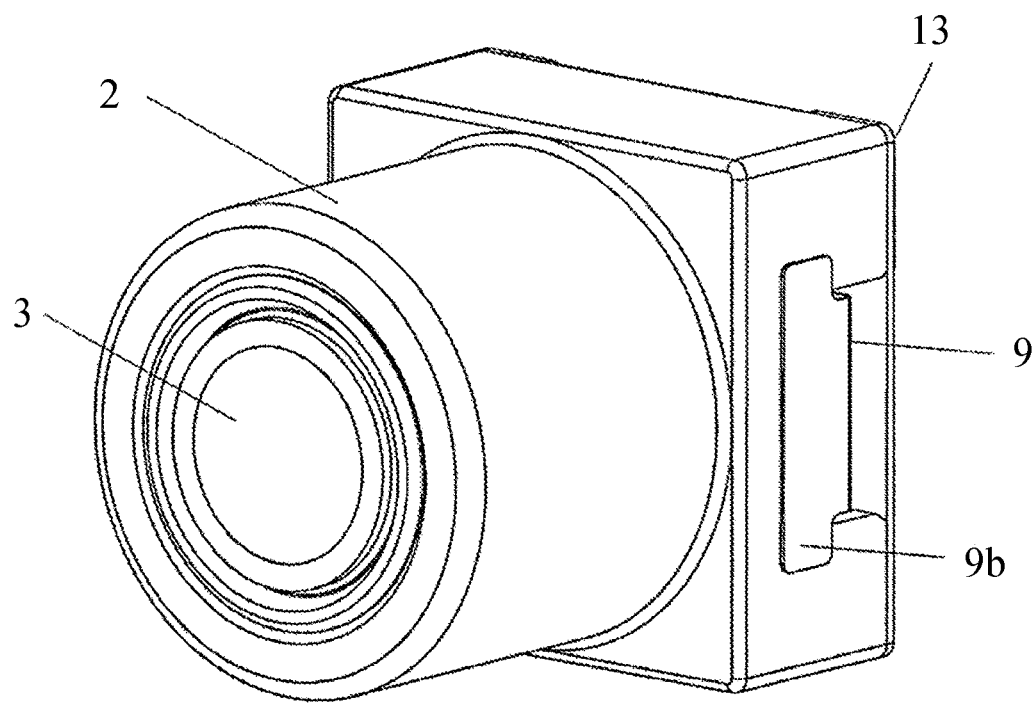
FIG. 5 is a perspective view of the camera module without a fixing member according to the first embodiment.
Figure 6:
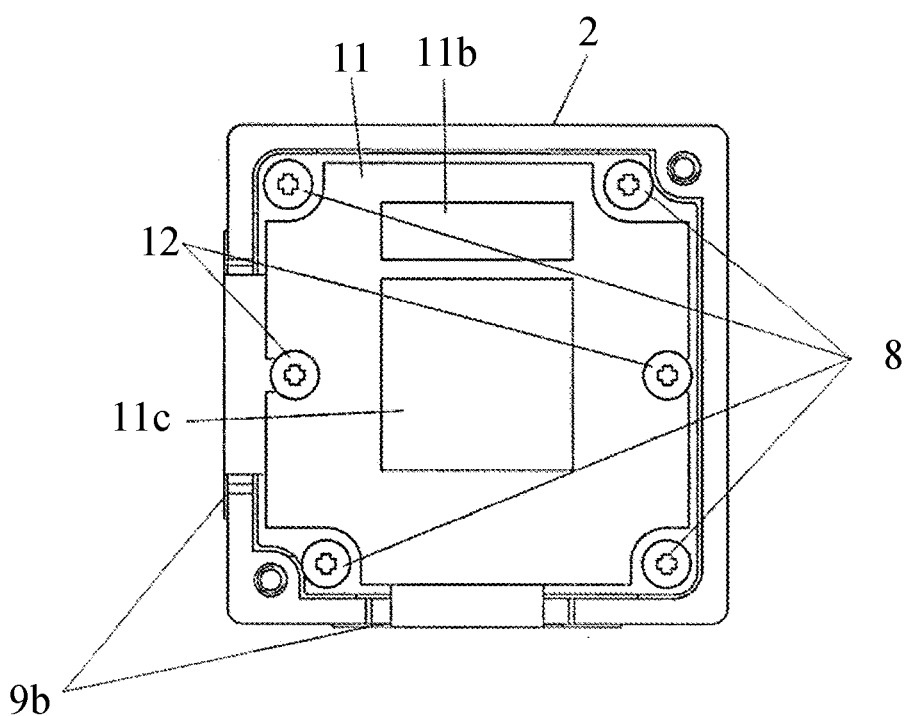
FIG. 6 is a rear view of the camera module without a cover and a fixing member according to the first embodiment.

Referring now to FIGS. 1 to 6, a description will be given of a camera module (image pickup apparatus) 1 according to a first embodiment of the disclosure. FIG. 1 is a perspective view of the camera module 1. FIG. 2 is a sectional view of the camera module 1. FIG. 3 is an exploded perspective view of the camera module 1 viewed from an object side. FIG. 4 is an exploded perspective view of the camera module 1 viewed from an image sensor side (image side). FIG. 5 is a perspective view of a state without a fixing member 15. FIG. 6 is a rear view without a cover 13 and the fixing member 15.

A holding frame (housing) 2 of the camera module 1 is made of metal with high thermal conductivity such as aluminum die-casting, and includes an inner diameter threaded portion 2a, a circular opening 2b, and a rectangular opening 2c. The lens unit 3 includes a lens frame 30 and lenses 31, 32, and 33 and is inserted into the circular opening 2b of the holding frame 2. An outer diameter portion of the lens frame 30 includes an outer diameter threaded portion 30a. In a case where the outer diameter threaded portion 30a and the inner diameter threaded portion 2a of the holding frame (housing) 2 are engaged with each other, the lens unit 3 is held by the holding frame 2 so that the position of the lens unit 3 in a direction along an optical axis OA (optical axis direction) is adjustable. While the lens frame 30 is configured to hold the lenses 31, 32, and 33 in this embodiment, the holding frame 2 may be configured to hold the lenses 31, 32, and 33.

A first circuit board 6 is an imaging board. The first circuit board 6 is mounted with an image sensor 5, a connector 6a, and an electric element (not illustrated). In the mounting portion of the image sensor 5 on the first circuit board 6, a rectangular opening 6b is formed at a position corresponding to the back surface of the image sensor 5 (surface opposite to a light-receiving surface facing the object side). The opening 6b is provided so as to expose the back surface of the image sensor 5. The first circuit board 6 is fixed to a sensor sheet metal 7 with screws 4 while the position of the first circuit board 6 is adjusted so that the center of the light-receiving surface of the image sensor 5 approximately coincides with the optical axis OA of the lens unit 3 in a direction orthogonal to the optical axis OA. The sensor sheet metal 7 is attached to a receiving portion (not illustrated) provided inside the rectangular opening 2c in the holding frame 2 and fixed with screws 8.

The camera module 1 can image the desired scene by imaging light rays condensed by the lens unit 3 on the image sensor 5. The positions of the lens unit 3 and the light-receiving surfaces of the image sensor 5 are different from individual to individual due to manufacturing variations in components and assembly. In a case where manufacturing variations are large relative to the depth of focus, the focus position of the lens unit 3 and the position of the light-receiving surface of the image sensor 5 may not coincide within the range of the depth of focus after the assembly with no care. In such a case, it is necessary to adjust the focus position of the lens unit 3 and the position of the light-receiving surface of the image sensor 5 during assembly so that they coincide within the range of the depth of focus. Therefore, optical position adjustment (focusing) is made while the focus performance is confirmed with a captured image or an evaluation value for the image.

More specifically, the optical position adjustment is made by providing an evaluation chart in front (on the object side) of the lens unit 3, by confirming the resolution and contrast value from the captured chart image, and by moving the lens unit 3 in the optical axis direction to a position that satisfies the required image quality. In order to maintain the adjusted image quality, it is important to maintain the relative positions between the lens unit 3 and the image sensor 5 in the optical axis direction. However, in a case where a load is applied to the image sensor 5 or the first circuit board 6 mounted with the image sensor 5, the position of the image sensor 5 in the optical axis direction changes over time and the image quality may deteriorate. Therefore, it is necessary to reduce the load applied to the image sensor 5 or the first circuit board 6 in the optical axis direction.

A second circuit board 11 is a control board. A second circuit board 11 is placed opposite to the first circuit board 6. Connectors 11a and 11b and an electric element 11c as a heat source are mounted on the second circuit board 11. The connector 11a of the second circuit board 11 is inserted into the connector 6a of the first circuit board 6, and the first circuit board 6 and the second circuit board 11 are fixed to the sensor sheet metal 7 with screws 12 while the first circuit board 6 and the second circuit board 11 are electrically connected. A cable (not illustrated) is connected to the connector 11b of the second circuit board 11. Power supply to the second circuit board 11 and electric signal transmission and reception are made through the cable. In this embodiment, the first circuit board 6 and the second circuit board 11 are electrically connected by the connectors 6a and 11a, but the disclosure is not limited to this embodiment. Instead of the connectors, they may be electrically connected via an FPC (Flexible Printed Circuit), an FFC (Flexible Flat Cable), or the like.

The cover 13 is fixed to the holding frame 2 with screws 14 so as to cover the back surface of the second circuit board 11. One end 9a of a heat radiating sheet 9 is disposed inside the opening 6b formed in the first circuit board 6 and contacts the back surface of the image sensor 5. The other end 9b of the heat radiating sheet 9 is disposed so as to contact the outer surface of the rectangular opening 2c in the holding frame 2. The heat radiating sheet 9 is made of a material having high thermal conductivity such as a graphite sheet, and radiates the heat emitted from the image sensor 5 to the holding frame 2. The heat radiating sheet 9 is placed between the first circuit board band the second circuit board 11.

A flexible member 10 includes a thermally conductive gel member that uses, as a base material, silicone that is applicable in a free shape by a dispenser. The flexible member 10 is made of a soft material and is easily moved or deformed in a case where an external force is applied. In a case where there is a sufficient area around the flexible member 10 that allows the flexible member 10 to move or deform, the flexible member 10 itself will not be substantially compressed and the load generated by sandwiching the flexible member 10 will be small. In the optical axis direction of the lenses 31, 32, and 33, the first circuit board 6, the heat radiating sheet 9, the flexible member 10 and the second circuit board 11 are arranged in that order.

The flexible member 10 is applied to the surface of the one end 9a of the heat radiating sheet 9 opposite to the surface that contacts the image sensor 5. By fixing the second circuit board 11 to the sensor sheet metal 7 with a predetermined application amount of the flexible member 10, the flexible member 10 is sandwiched and pressed between the heat radiating sheet 9 and the second circuit board 11. At this time, the flexible member 10 moves or deforms following the surface shapes of the heat radiating sheet 9 and the second circuit board 11, and the flexible member 10 and contacts the heat radiating sheet 9 and the second circuit board 11.

In this embodiment, the position where the flexible member 10 contacts the second circuit board 11 overlaps at least part of a projection portion in the optical axis direction of the electric element 11c as the heat source mounted on the second circuit board 11. In other words, at least part of the contact position between the flexible member 10 and the second circuit board 11 overlaps at least part of the projection position of the electric element 11c in the optical axis direction. Thereby, the heat emitted from the electric element 11c can be more efficiently radiated to the holding frame 2 via the flexible member 10 and the heat radiating sheet 9.

The one end 9a of the heat radiating sheet 9 is pressed against the back surface of the image sensor 5 by the flexible member 10, and the adhesion performance between the heat radiating sheet 9 and the image sensor 5 can be improved with a small load. The other end 9b of the heat radiating sheet 9 is fixed to and pressed against the holding frame 2 by the fixing member 15, which is an adhesive tape (tape material), and the adhesion performance between the heat radiating sheet 9 and the holding frame 2 can be improved. By improving the adhesion performance between the heat radiating sheet 9 and the image sensor 5 and the holding frame 2, the heat radiation from the image sensor 5 and the electric element 11c to the holding frame 2 can be improved. As a consequence, the image sensor 5 can be prevented from becoming hot and the performance of the image sensor 5 can be maintained.

As described above, this embodiment can realize an image pickup apparatus that can efficiently radiate heat from the image sensor and make small the load applied to the image sensor in a configuration where the imaging board and the control board are stacked in the optical axis direction.

Second Embodiment

Figure 7:
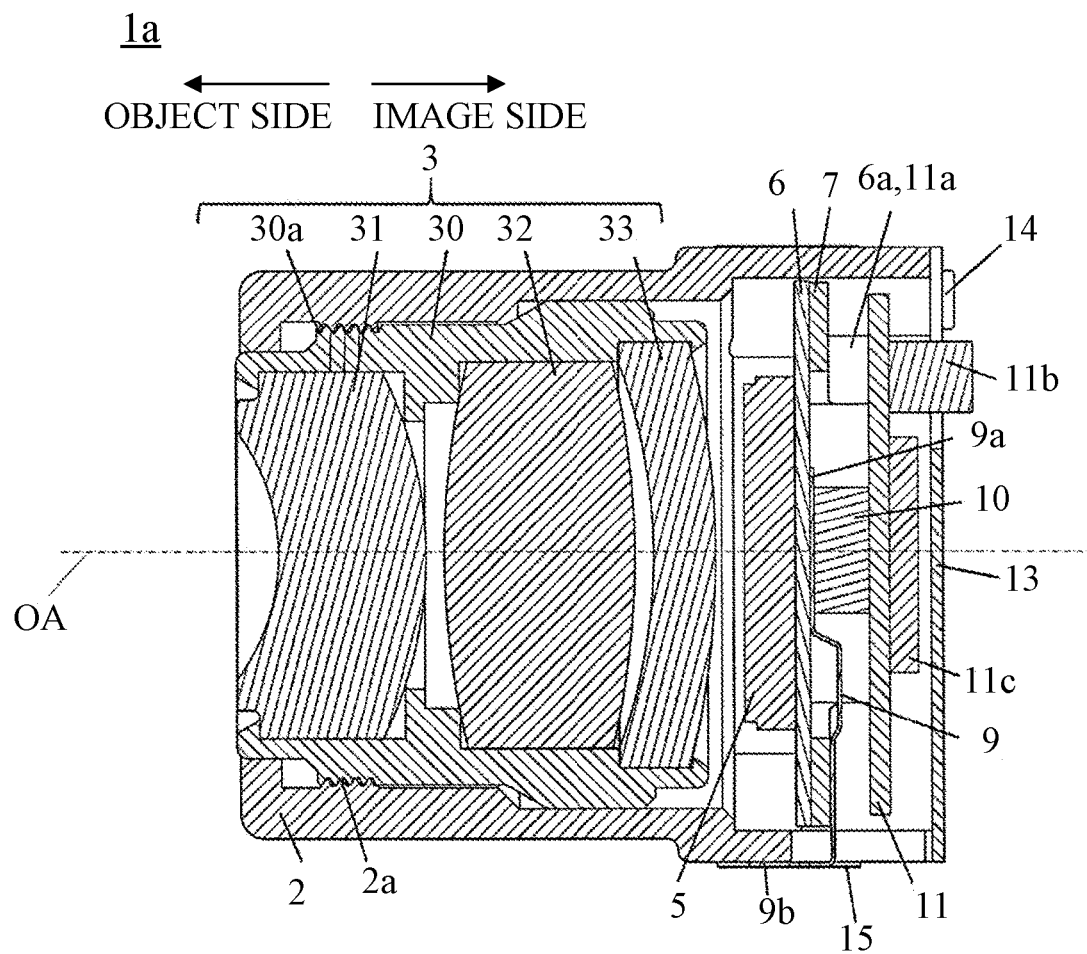
FIG. 7 is an exploded perspective view of the camera module according to a second embodiment viewed from the object side.
Figure 8:
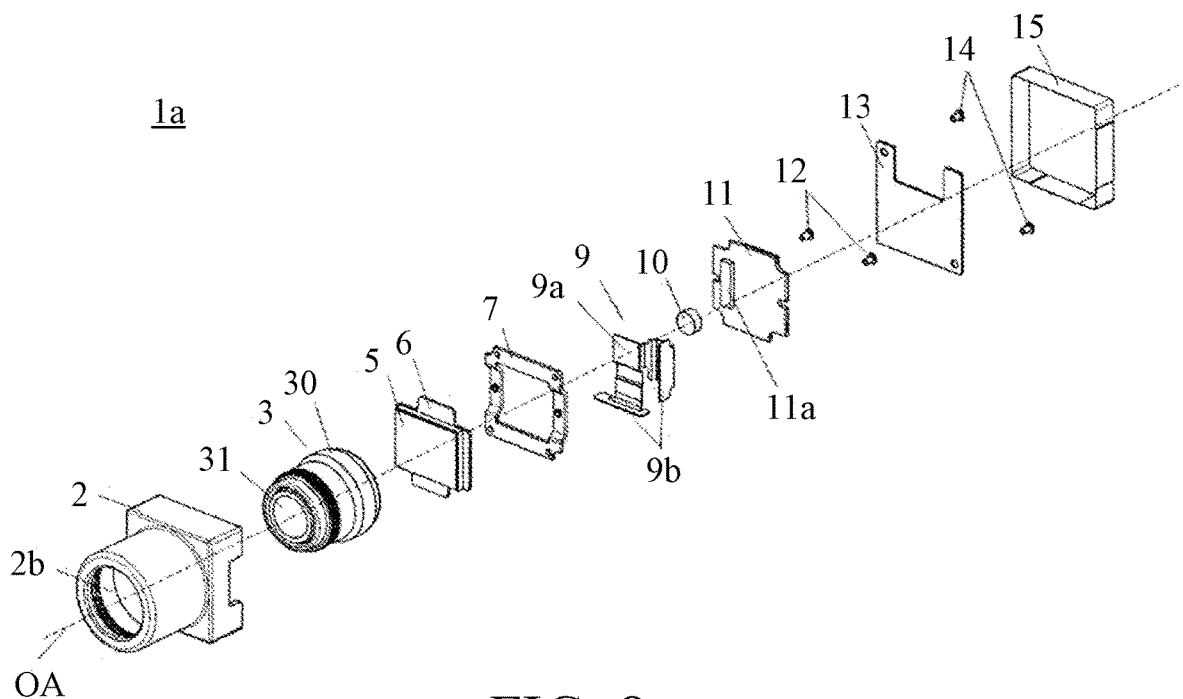
FIG. 8 is an exploded perspective view of the camera module according to the second embodiment viewed from the image side.
Figure 9:
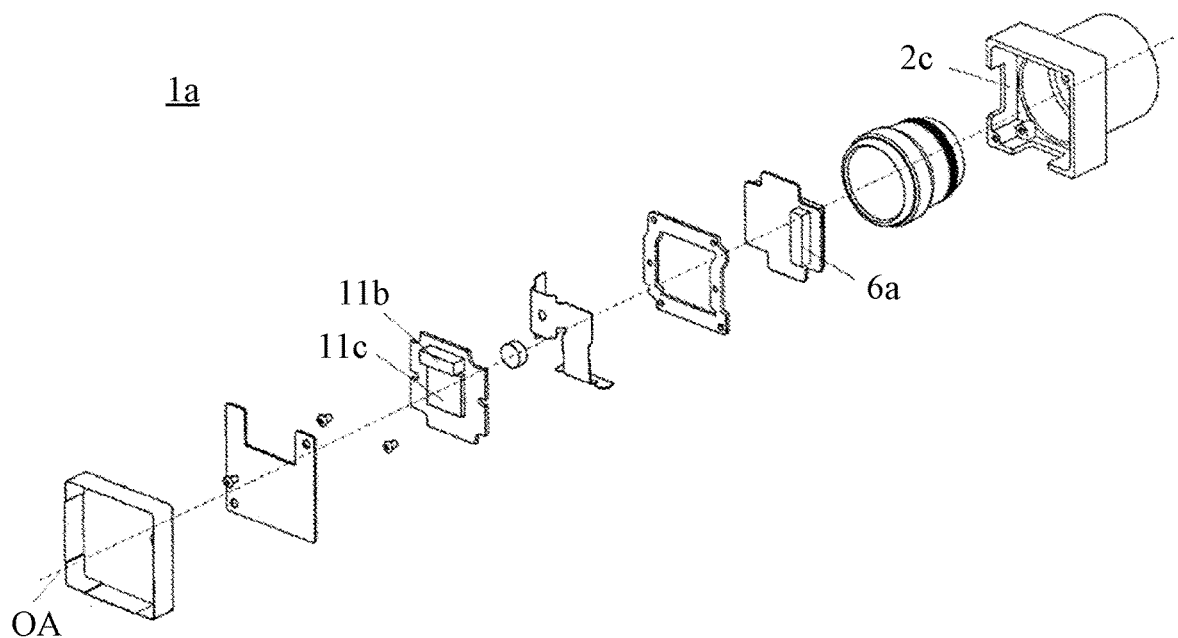
FIG. 9 is a sectional view of a camera module according to the second embodiment.

Referring now to FIGS. 7 to 9, a description will be given of a camera module (image pickup apparatus) 1a according to a second embodiment of the disclosure. FIG. 7 is a sectional view of the camera module 1a. FIG. 8 is an exploded perspective view of the camera module 1a viewed from the object side. FIG. 9 is an exploded perspective view of the camera module 1a viewed from the image sensor side (image side). Those elements in this embodiment, which are corresponding elements in the first embodiment, will be designated by the same reference numerals, and a description thereof will be omitted.

The first circuit board 6 is adhered to the sensor sheet metal 7 in a position-adjusted state where the center of the light-receiving surface of the image sensor 5 substantially coincides with the optical axis OA of the lens unit 3 in the direction orthogonal to the optical axis. The first circuit board 6 in this embodiment has no opening 6b, unlike the first embodiment. The sensor sheet metal 7 is adhered to a receiving portion (not illustrated) provided inside the rectangular opening 2c in the holding frame 2.

The one end 9a of the heat radiating sheet 9 is disposed so as to contact the board surface of the first circuit board 6. The other end 9b of the heat radiating sheet 9 is disposed so as to contact the outer surface of the rectangular opening 2c in the holding frame 2. The heat radiating sheet 9 radiates the heat emitted from the image sensor 5 to the holding frame 2 via the first circuit board 6.

The flexible member 10 is applied to the surface of the one end 9a of the heat radiating sheet 9 opposite to the surface that contacts the first circuit board 6, and is sandwiched and pressed between the heat radiating sheet 9 and the second circuit board 11. Thereby, the heat emitted from the electric element 11c can be radiated to the holding frame 2 via the flexible member 10 and the heat radiating sheet 9.

The one end 9a of the heat radiating sheet 9 is pressed against the board surface of the first circuit board 6 by the flexible member 10, and the adhesion performance between the heat radiating sheet 9 and the first circuit board 6 can be improved with a small load. By improving the adhesion performance between the heat radiating sheet 9 and the first circuit board 6 and the holding frame 2, the heat radiation from the image sensor 5 and the electric element 11c to the holding frame 2 can be improved. As a consequence, the image sensor 5 can be prevented from becoming hot and the performance of the image sensor 5 can be maintained.

As described above, this embodiment can realize an image pickup apparatus that can efficiently radiate heat from the image sensor and make small the load applied to the image sensor in a configuration where the imaging board and the control board are stacked in the optical axis direction.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-205129, filed on Dec. 17, 2021, which is hereby incorporated by reference herein in its entirety.

What is claimed is:

1. An image pickup apparatus comprising:
   a housing with an opening, the housing being made of metal;
   a first circuit board mounted with an image sensor;
   a second circuit board mounted with an electric element and is placed opposite to the first circuit board;
   a heat radiating sheet that contacts the image sensor and the housing; and
   a flexible member placed between and contacting the heat radiating sheet and the second circuit board,
   wherein the flexible member includes a gel member,
   wherein there is an area around the gel member that allows the gel member to move or deform,
   wherein a first area of the heat radiating sheet contacts a back surface of the image sensor, and
   wherein a second area of the heat radiating sheet is folded with respect to the first area, disposed outside the housing via the opening of the housing, contacts an outer surface of the housing, and is fixed to the outer surface of the housing by using a fixing member.

2. The image pickup apparatus according to claim 1, wherein the first circuit board has an opening that exposes the back surface of the image sensor.

3. The image pickup apparatus according to claim 1, wherein the flexible member has thermal conductivity.

4. The image pickup apparatus according to claim 1, wherein the electric element serves as a heat source.

5. The image pickup apparatus according to claim 1, wherein at least part of a contact position between the flexible member and the second circuit board overlaps at least part of the electric element when viewed in an optical axis direction.

6. The image pickup apparatus according to claim 1, wherein the heat radiating sheet includes a graphite sheet.

7. The image pickup apparatus according to claim 1, wherein the fixing member includes a tape material.

8. An image pickup apparatus comprising:
   a housing with an opening, the housing being made of metal;
   a first circuit board mounted with an image sensor;
   a second circuit board mounted with an electric element and is placed opposite to the first circuit board;
   a heat radiating sheet that contacts the first circuit board and the housing;
   a flexible member placed between and contacting the heat radiating sheet and the second circuit board,
   wherein the flexible member includes a gel member, and
   wherein there is an area around the gel member that allows the gel member to move or deform,
   wherein a first area of the heat radiating sheet contacts a board surface of the first circuit board, and
   wherein a second area of the heat radiating sheet is folded with respect to the first area, disposed outside the housing via the opening of the housing, contacts an outer surface of the housing, and is fixed to the outer surface of the housing by using a fixing member.

9. The image pickup apparatus according to claim 8, wherein the flexible member has thermal conductivity.

10. The image pickup apparatus according to claim 8, wherein the electric element serves as a heat source.

11. The image pickup apparatus according to claim 8, wherein at least part of a contact position between the flexible member and the second circuit board overlaps at least part of a projection position of the electric element in an optical axis direction.

12. The image pickup apparatus according to claim 8, wherein the heat radiating sheet includes a graphite sheet.

13. The image pickup apparatus according to claim 8, wherein the fixing member includes a tape material.

* * * * *